United States Patent
Comble et al.

(10) Patent No.: US 7,122,223 B1
(45) Date of Patent: Oct. 17, 2006

(54) METHOD FOR VACUUM DEPOSIT ON A CURVED SUBSTRATE

(75) Inventors: Pascal Comble, Le Perreux-sur-Marne (FR); Gerhard Keller, St Maur (FR); Frédéric Mouhot, Potault-Combault (FR)

(73) Assignee: Essilor International (Compagnie Generale D'Optique), Charleston le Pont (FR)

( * ) Notice: Subject to any disclaimer, the term of this patent is extended or adjusted under 35 U.S.C. 154(b) by 0 days.

(21) Appl. No.: 09/786,412

(22) PCT Filed: Sep. 2, 1999

(86) PCT No.: PCT/FR99/02092

§ 371 (c)(1),
(2), (4) Date: May 10, 2001

(87) PCT Pub. No.: WO00/14294

PCT Pub. Date: Mar. 16, 2000

(30) Foreign Application Priority Data

Sep. 4, 1998 (FR) .................................. 98 11100

(51) Int. Cl.
*B05D 1/32* (2006.01)

(52) U.S. Cl. .................. 427/282; 427/248.1; 427/164; 427/162; 427/166; 427/165; 427/167

(58) Field of Classification Search ................ 427/569, 427/585, 162, 164, 165, 166, 167, 248.1, 427/255.5, 294; 204/192.1, 192.12, 192.26, 204/298.11, 298.27, 298.28; 351/44, 159, 351/166, 177; 118/720, 728, 729, 730, 504, 118/505
See application file for complete search history.

(56) References Cited

U.S. PATENT DOCUMENTS 3,627,569 A    12/1971  Beecham
4,222,345 A *  9/1980  Bergfelt et al. ............. 118/720
4,257,692 A *  3/1981  Le Naour-Sene ........... 351/159
5,225,057 A    7/1993  LeFebvre et al.
5,254,236 A * 10/1993  Kinokiri et al. ........ 204/298.11
5,389,397 A    2/1995  Brennesholtz
5,393,398 A *  2/1995  Sugano .................. 204/298.11
5,513,038 A *  4/1996  Abe ........................... 359/580
5,724,189 A *  3/1998  Ferrante ..................... 359/634
5,993,904 A * 11/1999  Boucher .................. 427/248.1

FOREIGN PATENT DOCUMENTS

| DE | 38 16 578      | 3/1989 |
| FR | 1 380 432      | 3/1965 |
| JP | 60-218470 A  * | 11/1985 |
| JP | 62-239103      | 4/1988 |
| JP | 03-31473 A   * | 2/1991 |
| JP | 03-264668 A  * | 11/1991 |
| JP | 06-192835 A  * | 7/1994 |

* cited by examiner

*Primary Examiner*—Timothy Meeks
*Assistant Examiner*—Howard Abramowitz
(74) *Attorney, Agent, or Firm*—Young & Thompson

(57) ABSTRACT

The invention concerns a method which consists in a process known per se in producing, on the curved substrate (10) to be treated, a film of material derived from a specific material source (13). The invention is characterized in that it consists in inserting, between the curved substrate (10) and the material source (13), a mask (19) relative to the curved substrate (10), preferably selecting as mask (19), a mask comprising a ring-shaped part (20). The invention is particularly useful for providing lenses with antiglare treatment.

22 Claims, 2 Drawing Sheets

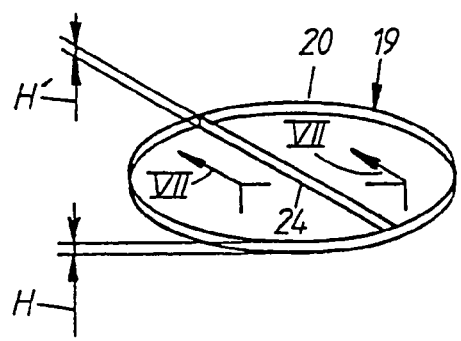
FIG 6
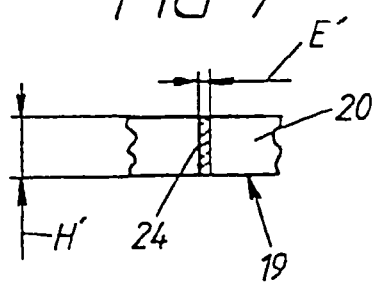
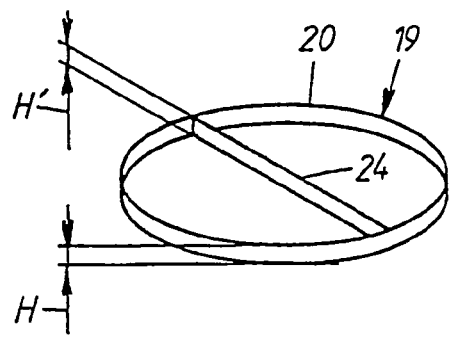
FIG 8
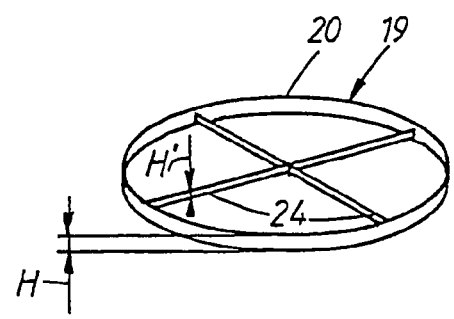
FIG 9
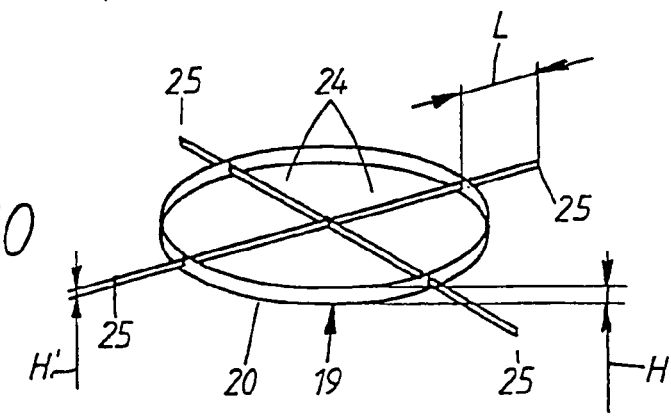
FIG 10

METHOD FOR VACUUM DEPOSIT ON A CURVED SUBSTRATE

BACKGROUND OF THE INVENTION

The present invention relates in a general manner to the vacuum treatment of any substrate of the kind in which, using a sputtering technique, the deposition of a layer of material coming from a given source of material is carried out, everywhere, in a chamber, on this substrate by subjecting, for example, this source of material, which then serves as a cathode, to a suitable ion bombardment, the result of which is that particles are torn off it and these are then deposited on the substrate.

The invention is aimed more particularly at the case in which the treated substrate is a curved substrate, or even a highly curved substrate, as is the case, at least, in certain spectacle lenses, particularly those of high power.

The expression "curved substrate" should therefore be understood to mean here, more generally, a substrate which, in the manner of a spectacle lens, has a curvature accentuated to a greater or lesser extent in at least one transverse plane.

Thus, as is known, it is usual to apply a vacuum treatment to certain spectacle lenses in order to give them particular properties, for example antireflection properties.

One of the problems to be solved in terms of material is to ensure the complete thickness uniformity desirable for the layer of material thus deposited.

The term "thickness" should be understood to mean here, and throughout the following, the optical thickness of the deposited layer, that is to say the physical thickness of this layer multiplied by the refractive index of the material of which it is composed.

Should good uniformity of this thickness be lacking, any possible residual reflection runs the risk of resulting in undesirable iridescence.

Now, the thickness of the deposited layer of material is inversely proportional to the distance of the spectacle lens, or more generally of the treated substrate, from the corresponding source of material.

When, as is the case here, the substrate is curved, this distance is greater at its periphery than its centre and the thickness of the coating obtained is therefore smaller at this periphery than at its centre.

This thickness difference may become significant when, for practical reasons, the curved substrate is placed a short distance from the source of material, the difference in distance between its periphery and its centre with respect to this source of material then becoming appreciable because of its very curvature.

In practice, this thickness difference may commonly be as much as 20%, depending on the substrates and the chamber employed.

SUMMARY OF THE INVENTION

The subject of the present invention is, in a general manner, an arrangement allowing this thickness difference to be reduced very simply.

More specifically, the subject of the invention is firstly a process for the vacuum treatment of any curved substrate, of the kind in which a layer of material coming from a given source of material is deposited on this curved substrate, this process being generally characterized in that a mask is interposed between the curved substrate and the source of material at a certain distance from the curved substrate, the said mask being stationary with respect to the curved substrate; the subject of the invention is also any mask suitable for implementing such a process.

Admittedly, it is already known to employ, for various reasons, a mask during the vacuum treatment of a curved substrate, as is the case, for example, in U.S. Pat. No. 5,225,057.

However, in this U.S. Pat. No. 5,225,057, the treated curved substrate is driven in rotation about itself, so that the mask is not stationary with respect to it.

Furthermore, this mask is employed only for limiting the beam angle of the beam by means of which the desired deposition is carried out, without it being intended for there to be any effect on the actual thickness of the layer of material obtained in terms of this deposition.

Admittedly, it is also already known, especially from U.S. Pat. No. 5,389,397, to use, during the vacuum treatment of a substrate, a mask which is stationary with respect to this substrate.

However, in this U.S. Pat. No. 5,389,397, the treated substrates are flat.

With regard to the deposition peculiarities involved when the substrate is a curved substrate, it was impossible to imagine a priori that a stationary mask could also be suitable for such a curved substrate.

Furthermore, in this U.S. Pat. No. 5,389,397, the mask used is solid.

Now, somewhat surprisingly, it turns out that, with the mask according to the invention, significant results are obtained when this mask includes an annular part.

Without there being any certainty in this regard, it is conceivable, for example, that, at the working pressures employed, which are generally greater than 0.1 Pa, since the mean free path of the coating particles involved is of the order of a few millimeters, these coating particles are subject to multiple reflections from the atoms of the plasma gas, that, because of these multiple reflections and because of the configuration of the chamber employed, a greater flux of particles is normally created in the direction of the centre of the substrate than in the direction of its periphery and that, with the interposition of a mask according to the invention, and more particularly of a mask including an annular part, between the source of material and the substrate, this flux of particles is probably less directional, this flux then being at least partially limited at the centre of the substrate, which is the point where, in the absence of such a mask, a surplus of deposited material is usually observed.

Nevertheless, it is observed, and this is borne out by tests, that, with a mask having, according to the invention, an annular part, the measured thickness difference, for the coating obtained, between the periphery of the treated curved substrate and the centre of the latter, instead of being of the order of 20%, may advantageously be reduced to less than 15%, or even less than 10%, all other conditions being the same.

Even more satisfactory results may be observed when, in a development of the invention, the mask employed has, inside its annular part, at least one crosspiece which connects two regions of this annular part together, for example along a diameter of the latter, with, optionally in this case, in a complementary development of the invention, on the outside of the annular part, at each of the ends of such a crosspiece, an arm which extends radially with respect to the annular part in the extension of this crosspiece.

In such a case, the thickness difference observed between the periphery of the treated curved substrate and the centre of the latter may, advantageously, be reduced to less than 5%, all other conditions being the same.

In all cases, the results obtained with a mask according to the invention are all the more surprising since, in practice, this mask may advantageously have, with respect to the treated curved substrate, a relatively small extension, which, if desired, makes it possible to limit the overall size of the assembly to that of the curved substrate alone, and which thereby makes it possible, as a corollary, to avoid possible shadowing difficulties.

In particular, especially favourable results may be obtained with a mask whose projection on a plane in a direction perpendicular to this plane has an area of less than 10%, or even less than 5%, of the area of the projection of the curved substrate on this same plane.

BRIEF DESCRIPTION OF THE DRAWINGS

The characteristics and advantages of the invention will, moreover, emerge from the description which follows, given by way of example, with reference to the appended schematic drawings in which:

FIG. 6 is also a perspective view, similar to that in FIG. 3, for another alternative embodiment;

FIG. 7 is, on a larger scale, a partial axial sectional view of this other alternative embodiment, on the line VII—VII in FIG. 6; and FIGS. 8, 9 and 10 are perspective views which, also being similar to that in FIG. 3, each relate, respectively, to other alternative embodiments of the mask according to the invention.

DESCRIPTION OF THE PREFERRED EMBODIMENTS

These figures illustrate, by way of example, the application of the invention to the case in which the curved substrate 10 to be treated is a spectacle lens or, more specifically, a disc of circular contour from which such a spectacle lens is subsequently cut out.

Let $D_1$ be the diameter of this curved substrate 10 along its contour.

This diameter $D_1$ is usually between 65 mm and 80 mm.

In the embodiment illustrated, the curved substrate 10 is, for example, concavo-convex.

When a vacuum treatment has to be applied to it, such a curved substrate 10 is usually supported, around its periphery, by a support 11 suitable for holding it.

Since this support 11 is well known per se and does not pertain at all to the present invention, it will not be described here.

Figure 1:
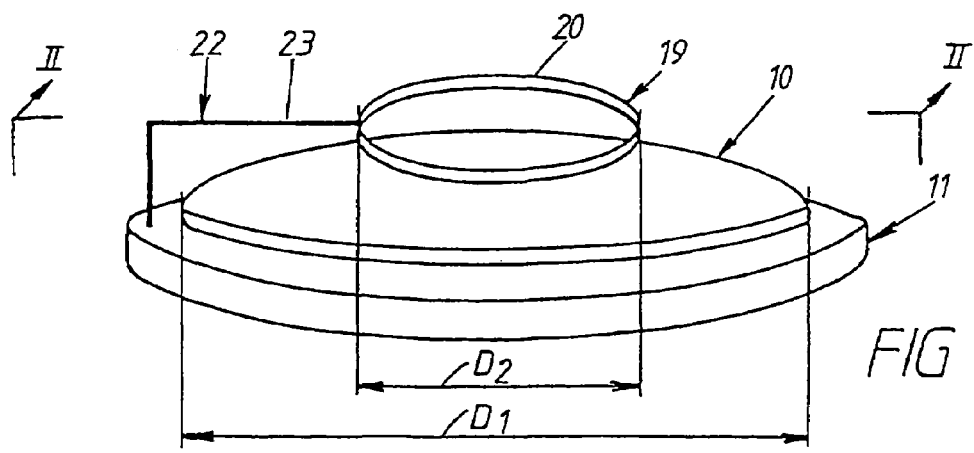
FIG. 1 is a perspective view of a curved substrate to be treated, illustrated in place on a substrate, with the mask with which it is associated, according to the invention.
Figure 2:
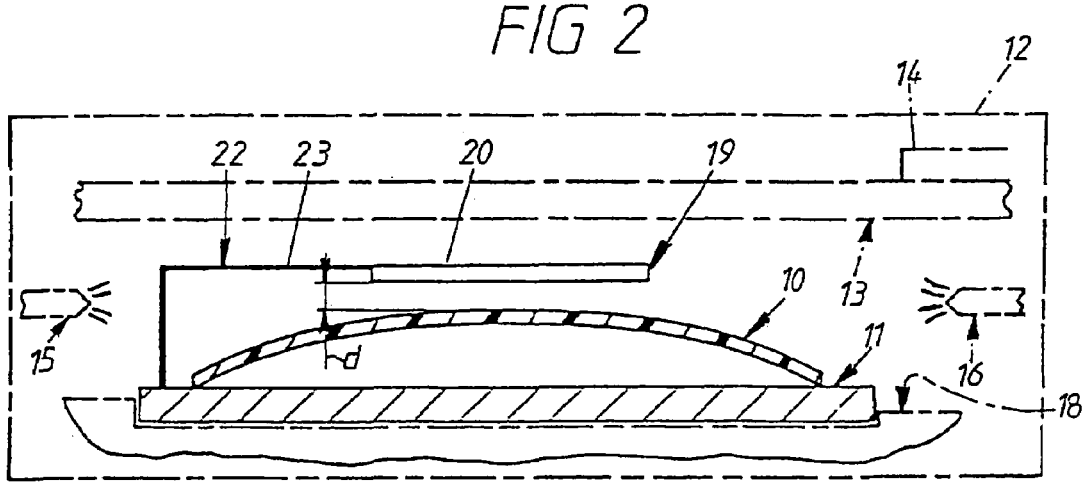
FIG. 2 is an axial sectional view of the assembly, on the line II—II in FIG. 1.

Furthermore, it is also for the sake of convenience that it is illustrated in FIGS. 1 and 2 in the form of a flat disc of circular contour.

In fact, this support 11 may have very diverse configurations, or indeed may even be perforated.

Nevertheless, for the desired vacuum treatment, and in a manner known per se, a layer of material coming from a suitable source of material 13 is deposited on the curved substrate 10 thus supported by a support 11, in a chamber 12 shown schematically by the broken lines in FIG. 2, the source of material also being shown schematically in broken lines in this FIG. 2.

A machine used, for example, for this purpose is sold by Applied Vision Ltd under the brand name PLASMACOAT AR.10™.

This machine is also described in International Patent Application No. WO-A-92/13114.

For example, and as shown schematically at 14 in FIG. 2, the source of material 13 is placed at a negative potential, in order to form a cathode, and introduced into the chamber 12 are, on the one hand, for example via a nozzle 15, an inert gas, for example argon, and, on the other hand, for example via a nozzle 16, an active gas, for example oxygen.

In general, a gas pressure of greater than 0.1 Pa is used.

Preferably, this gas pressure is between 0.2 Pa and 2 Pa.

As a corollary, the support 11 is usually, and as illustrated, an individual support and, together with other supports 11 of the same type, each supporting a curved substrate 10 to be treated, it is fitted, as shown schematically by broken lines in FIG. 2, onto a collective support 18, for example in the form of a plate, mounted so as to rotate in the chamber 12.

As a variant, the support 11 may just as well move in a linear fashion beneath the source of material 13.

Whatever the case, the inert gas introduced via the nozzle 15 ionizes on entering the chamber 12, forming as it were a plasma therein, and the positive ions which thus arise therefrom bombard the source of material 13, which forms a target, and they thus tear off from this source of material 13 particles which, while combining with the active gas introduced via the nozzle 16, become deposited on the curved substrate 10, forming on its surface the desired layer of material.

The above arrangements are well known per se and will therefore not be described in detail here.

According to the invention, a mask 19 is interposed between the curved substrate 10 and the source of material 13, this mask being stationary with respect to the curved substrate 10.

Preferably, and as illustrated, a mask having an annular part 20 is chosen as the mask 19.

In practice, this annular part 20 has a circular contour.

For example, and as illustrated, a mask whose annular part 20 has, on the outside, a diameter $D_2$ of less than twice the diameter $D_1$ of the curved substrate 10 is chosen for the mask 19.

More specifically, a mask whose annular part 20 has, on the outside, a diameter $D_2$ of between one quarter of the diameter $D_1$ of the curved substrate 10 and twice this diameter $D_1$ is preferably chosen for the mask 19.

Moreover, it is possible to indicate, in this regard, by way of numerical example, but without this being able to result in any limitation of the invention, that, with a curved substrate 10 whose diameter $D_1$ is about 65 mm, whose power is six dioptres and whose radius of the convex front face is 62.13 mm, satisfactory results have been obtained with a mask 19 whose annular part 20 has, on the outside, a diameter $D_2$ of between 20 mm and 130 mm.

Whatever the case, since the curved substrate 10 is supported, as indicated above, by a support 11, the mask 19 is fastened, for example, to this support 11.

In the embodiment illustrated, the mask 19 is, in practice, attached to the support 11 by a bracket 22 and extends in cantilever fashion from the end of the cross-arm 23 of this bracket 22.

Of course, it is preferred to make this bracket 22 as small as possible so as to minimize the shadowing that it may cause during deposition of material on the curved substrate 10.

Nevertheless, and as illustrated, the mask 19 is preferably placed at a distance from the curved substrate 10 and approximately parallel to the latter.

Let d be this distance, measured between the mask 19, at its base, and the highest point of the curved substrate 10, as indicated in FIG. 2.

For example, this distance d is less than twice the diameter $D_1$ of the curved substrate 10.

Preferably, it is between one tenth of the diameter $D_1$ of the curved substrate 10 and half this diameter $D_1$.

Moreover, it is possible to indicate in this regard, by way of non-limiting example, and under the same conditions as above, that satisfactory results have been obtained with a distance d between the mask 19 and the curved substrate 10 of less than 130 mm and preferably between 7 mm and 30 mm.

In the embodiments illustrated in FIGS. 1 to 5, the mask 19 is reduced to its annular part 20.

For example, and as illustrated, the cross section of this annular part 20 is generally rectangular.

Let H be its height, measured along the axis of the curved substrate 10, and therefore perpendicular to the support 11 which supports it, and let E be its radial thickness, measured parallel to this support 11.

Preferably, and this is the case in the embodiments illustrated, the annular part 20 of the mask 19 has, in cross section, a height H greater than its radial thickness E.

For example, this height H is less than 15 mm.

Preferably, it is between 1 mm and 15 mm.

Moreover, it is possible to indicate in this regard, by way of non-limiting example, and under the same conditions as above, that satisfactory results have been obtained with a height H of between 1 mm and 10 mm.

Likewise, satisfactory results have been obtained with a radial thickness E of less than 2 mm.

For example, this radial thickness E is less than 1 mm.

Moreover, it is possible to indicate in this regard, by way of non-limiting example, and under the same conditions as above, that satisfactory results have been obtained with a radial thickness E of about 0.1 mm.

Moreover it appears that, in order to obtain satisfactory results, it is desirable to take into account the diameter $D_1$ of the curved substrate 10 to be treated when choosing the diameter $D_2$ of the annular part 20 of the mask 19 employed.

To do this, according to the invention, care is taken to ensure that at least one of the following formulae, and preferably each of them, is satisfied:

$$d + H = A \cdot \frac{D_2}{2} \quad \text{(I)}$$

$$d = B \cdot \frac{D_2}{2} \quad \text{(II)}$$

$$D_1 = C \cdot D_2 \quad \text{(III)}$$

in which d, H, $D_1$ and $D_2$ are the parameters already mentioned above, in which:

A is a coefficient of between 0.8 and 1, being for example about 0.92;

B is a coefficient of between 0.7 and 0.9, being for example about 0.77;

and C is a coefficient of between 2 and 3, being for example about 2.5.

Figure 3:
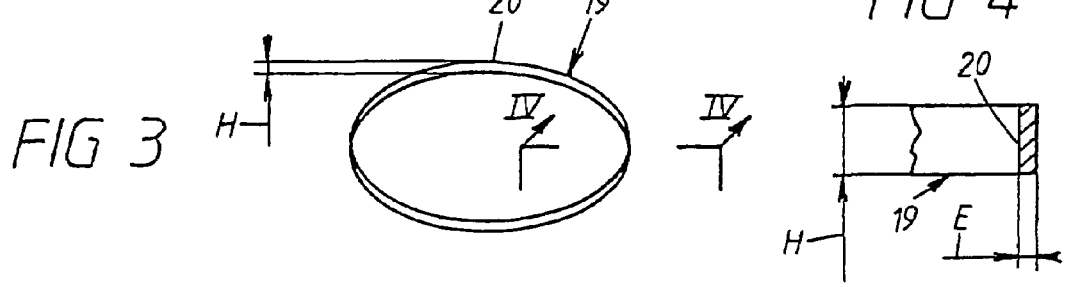
FIG. 3 is, taken from FIG. 1, but on a different scale, a perspective view of the mask according to the invention, illustrated in isolation.
Figure 5:
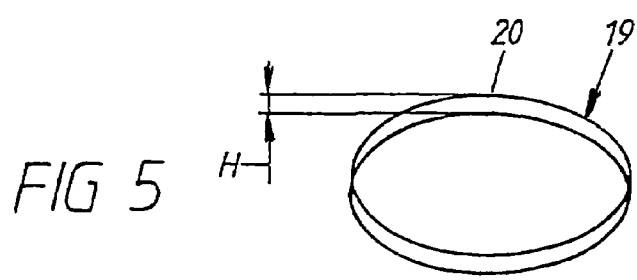
FIG. 5 is a partial perspective view, similar to that in FIG. 3, for an alternative embodiment.

In the embodiment illustrated in FIG. 5, the height H has a value twice the value that it has in the embodiment illustrated in FIG. 3.

In the embodiments illustrated in FIGS. 6 to 10, the mask 19 includes, inside its annular part 20, at least one crosspiece 24 which links together two regions of this annular part 20.

For example, and as illustrated in FIGS. 6 to 8, a single crosspiece 24 is provided and this crosspiece 24 extends along a diameter of the annular part 20.

Furthermore, in these embodiments, the cross section of this crosspiece 24 is generally rectangular and it extends approximately parallel to that of the annular part 20.

In the embodiments illustrated in FIGS. 6 to 8, the crosspiece 24 has itself, in cross section, a height H' equal to the height H of the annular part 20 and a radial thickness E' equal to the radial thickness E of this annular part 20.

It therefore extends, level with the annular part 20, both on the side of one of the portions of the latter and on the side of the other of these portions.

However, of course, the crosspiece 24 may, as a variant, have, in cross section, a height H' different from the height H of the annular part 20 and/or a radial thickness E' different from the radial thickness E of this annular part 20.

This is the case, by way of example, at least for the height H', in the embodiments illustrated in FIGS. 9 and 10, in which, moreover, the mask 19 according to the invention includes at least two crosspieces 24.

For example, and as illustrated, only two crosspieces 24 are thus provided and they are perpendicular to each other, each extending in practice along a diameter of the annular part 20.

For example, these two crosspieces 24 each have a construction similar to that of the previous cross section 24.

However, in the embodiments illustrated, their height H' is equal to half the height H of the annular part 20.

For example, and as illustrated, they extend halfway up this annular part 20.

Finally, in the embodiment illustrated in FIG. 10, the mask 19 includes, on the outside of its annular part 20, at least one arm 25 which extends radially with respect to this annular part 20, in a cantilever fashion from the latter.

In practice, this arm 25 has a structure similar to that of the crosspieces 24 and it extends along the extension of such a crosspiece 24.

Also in practice there is an arm 25 at each of the ends of a crosspiece 24 and, for both of the crosspieces 24, the various arms 25 thus used have the same length.

It is possible to indicate in this regard, by way of non-limiting example, and under the same conditions as above, that satisfactory results have been obtained with arms 25 having a length L of 10 mm.

In FIG. 6, the height H of the annular part 20 of the mask 19 is equal to that of the embodiment in FIG. 3.

On the other hand, in FIGS. 8 to 10, this height H has a value equal to that of the embodiment illustrated in FIG. 5.

However, in both cases this height H may be different.

Furthermore, according to an alternative embodiment (not illustrated), this height H of the annular part 20 of the mask 19 varies along the perimeter of the latter, extending, for example, between 2 mm and 15 mm, in order to take into account the relative movement between this mask 19 and the source of material 13.

In all cases, simply because of the structure of the mask 19 according to the invention, the shadow cast by the latter on the treated curved substrate 10 is advantageously particularly small.

More specifically, a mask whose projection on a plane in a direction perpendicular to this plane has an area of less than 10% of the area of the projection of the curved substrate 10 on this same plane under the same conditions is chosen, in this regard, according to the invention, for the mask 19, the plane of projection thus taken into account being, for example, that of the support 11 on which the treated curved substrate 10 rests.

Again, more specifically, a mask whose projection, under the conditions indicated above, has an area of less than 5% of the area of the projection of the curved substrate 10 is preferably chosen for the mask 19 according to the invention.

In all cases too, and to the extent that this can be confirmed, the material of which the mask 19 according to the invention is composed seems to have no effect on the results obtained.

This material may therefore be various materials.

For example, it may just as well be paper as stainless steel.

The table below summarizes, figure by figure, the results obtained with the various embodiments briefly described above.

In this table, Δ gives, in percent, the thickness difference observed for the coating obtained during a given treatment between the periphery of the curved substrate 10 and the centre of the latter.

Figure 4:
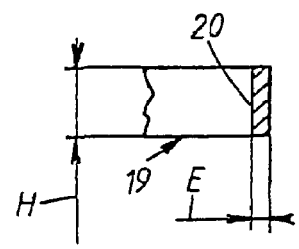
FIG. 4 is, on a larger scale, a partial axial sectional view of this mask, on the line IV—IV in figure 3.

|  | $D_1$ mm | $D_2$ mm | H mm | E mm | Δ % |
|---|---|---|---|---|---|
| FIGS. 3, 4 | 65 | 26 | 1 | 0.1 | 14 |
| FIG. 5 | 65 | 26 | 2 | 0.1 | 12 |
| FIGS. 6, 7 | 65 | 26 | 1 | 0.1 | 13 |
| FIG. 8 | 65 | 26 | 2 | 0.1 | 7 |
| FIG. 9 | 65 | 26 | 2 | 0.1 | 3.7 |
| FIG. 10 | 65 | 26 | 2 | 0.1 | 3.4 |

Of course, the present invention is not limited to the embodiments described and illustrated, but encompasses any alternative embodiment and/or implementation.

In particular, the contour of the annular part of the mask employed is not necessarily circular.

For example, this contour could be elliptical.

It could even have a more complex shape, being, for example, in the form of a spiral.

Furthermore, it is possible to vary the pressure of the gases inside the chamber employed.

For example, by increasing this pressure, it is possible to reverse the thickness difference observed, the thickness of the coating obtained then being less at the centre of the treated curved substrate than at the periphery of the latter.

The invention claimed is:

1. Process for the vacuum treatment of any curved substrate having a circular contour with a given diameter ($D_1$), comprising the steps of:

depositing a layer of material coming from a given source of material (13) on the curved substrate (10), while interposing a mask (19) between the curved substrate (10) and the source of material (13) at a certain distance from the curved substrate (10) and approximately parallel to the curved substrate, the mask being stationary with respect to the curved substrate (10), and selecting the mask to have an annular part (20) with a diameter ($D_2$) between one quarter and twice the given diameter ($D_1$) of the curved substrate (10);

wherein the certain distance is at least one tenth of, but less than twice, the diameter ($D_1$).

2. Process according to claim 1, comprising the further step of selecting the mask to have a projection on a plane, in a direction perpendicular to the plane, with an area of less than 10% of the area of the projection of the curved substrate (10) on the plane.

3. Process according to claim 2, comprising the further step of selecting the mask to have the projection with an area of less than 5% of the area of the projection of the curved substrate (10).

4. Process according to claim 1, wherein the certain distance is less than half the diameter ($D_1$) of the curved substrate.

5. Process according to claim 1, comprising the further steps of:

supporting the curved substrate (10) by a support (11), and fastening the mask (19) to the support (11).

6. Process according to claim 1, wherein a gas pressure of greater than 0.1 Pa is used in the depositing step.

7. Process according to claim 1, comprising the further step of selecting the mask to have the annular part (20) have, in cross section, a height (H) greater than a radial thickness (E) of the annular part.

8. Process according to claim 7, wherein the height (H) of the annular part (20) of the mask (19) is less than 15 mm.

9. Process according to claim 7, wherein the height (H) of the annular part (20) of the mask (19) varies along a perimeter of the annular part.

10. Process according to claim 7, wherein the mask consists of the annular part (20).

11. Process according to claim 7, wherein the mask includes, on the outside of the annular part (20), at least one arm (25) which extends radially with respect to the annular part (20), in a cantilever fashion from the annular part.

12. Process according to claim 7, wherein the cross section of the annular part (20) is generally rectangular.

13. Process according to claim 12, comprising the further step of selecting the mask to include, inside the annular part (20), at least one crosspiece (24) which links together two regions of the annular part (20), the cross section of the crosspiece (24) being generally rectangular, and the cross section of the crosspiece extending approximately parallel to the cross section of the annular part (20), wherein the cross section of the crosspiece and the cross section of the annular part are considered in the same cross section plane.

14. Process according to claim 7, comprising the further step of selecting the mask to include, inside the annular part (20), at least one crosspiece (24) which links together two regions of the annular part (20).

15. Process according to claim 14, wherein the crosspiece (24) extends along a diameter of the annular part (20).

16. Process according to claim 14, wherein the mask includes at least two crosspieces (24).

17. Process according to claim 16, wherein the two crosspieces (24) of the mask are perpendicular to each other.

18. Process according to claim 14, wherein the mask includes, on the outside of the annular part (20), at least one arm (25) which extends radially with respect to the annular part (20), in a cantilever fashion from the annular part, along an extension of one crosspiece (24).

19. Process according to claim 18, wherein the arm (25) and the crosspiece (24) have like cross-sections.

20. Process according to claim 18, wherein the arm (25) is located at each of the ends of the crosspiece (24).

21. Process for the vacuum treatment of any curved substrate having a circular contour with a given diameter ($D_1$), comprising the steps of:
depositing a layer of material coming from a given source of material (13) on the curved substrate (10), while interposing a mask (19) between the curved substrate (10) and the source of material (13) at a certain distance from the curved substrate (10), the mask being stationary with respect to the curved substrate (10), and
selecting the mask to have an annular part (20) satisfying at least one of the following formulae:

$$d+H=A \cdot D_2/2 \qquad \text{(I)}$$

$$d=B \cdot D_2/2 \qquad \text{(II)}$$

$$D_1=C \cdot D_2 \qquad \text{(III)}$$

in which:

d is the distance between the mask (19) and the highest point of the treated curved substrate (10);

H is the height of the annular part (20) of the mask (19);

$D_1$ is the diameter of the curved substrate (10);

$D_2$ is the diameter of the annular part (20) of the mask (19);

A is a coefficient of between 0.8 and 1;

B is a coefficient of between 0.7 and 0.9;

and C is a coefficient of between 2 and 3.

22. Process according to claim 21, wherein,

A is about 0.92;

B is about 0.77; and

C is about 2.5.

* * * * *

UNITED STATES PATENT AND TRADEMARK OFFICE
CERTIFICATE OF CORRECTION

PATENT NO. : 7,122,223 B1
APPLICATION NO. : 09/786412
DATED : October 17, 2006
INVENTOR(S) : Pascal Comble et al.

It is certified that error appears in the above-identified patent and that said Letters Patent is hereby corrected as shown below:

On the title page, Item to read as follows:

--(75) Inventors: Pascal Comble, Le Perreux-sur-Marne (FR); Gerhard Keller, St Maur (FR); Frédéric Mouhot, Pontault-Combault (FR)--.

On the title page, Item (73) to read as follows:

--(73) Assignee: Essilor International (Compagnie Generale D'Optique), Charenton le Pont (FR)--.

Signed and Sealed this

Ninth Day of January, 2007

JON W. DUDAS
*Director of the United States Patent and Trademark Office*